(12) United States Patent
Hashim et al.

(10) Patent No.: US 7,342,181 B2
(45) Date of Patent: Mar. 11, 2008

(54) MAXIMIZING CAPACITANCE PER UNIT AREA WHILE MINIMIZING SIGNAL TRANSMISSION DELAY IN PCB

(75) Inventors: Amid Hashim, Plano, TX (US); Abner Joseph, Carmel, IN (US)

(73) Assignee: CommScope Inc. of North Carolina, Hickory, NC (US)

( * ) Notice: Subject to any disclaimer, the term of this patent is extended or adjusted under 35 U.S.C. 154(b) by 278 days.

(21) Appl. No.: 10/798,389

(22) Filed: Mar. 12, 2004

(65) Prior Publication Data

US 2005/0199422 A1 Sep. 15, 2005

(51) Int. Cl.
*H05K 1/11* (2006.01)
(52) U.S. Cl. .................. 174/261; 174/258; 174/255; 174/256; 361/749; 361/762; 439/607; 439/677
(58) Field of Classification Search ............... 174/261, 174/258, 255, 256; 361/749, 762; 439/607, 439/677
See application file for complete search history.

(56) References Cited

U.S. PATENT DOCUMENTS

| | | | |
|---|---|---|---|
| 5,396,397 A * | 3/1995 | McClanahan et al. ...... 361/313 |
| 5,700,167 A | 12/1997 | Pharney et al. |
| 5,915,989 A | 6/1999 | Adriaenssens et al. |
| 5,997,358 A | 12/1999 | Adriaenssens et al. |
| 6,042,427 A | 3/2000 | Adriaenssens et al. |
| 6,050,843 A | 4/2000 | Adriaenssens et al. |
| 6,057,743 A | 5/2000 | Aekins |
| 6,089,923 A | 7/2000 | Phommachanh |
| 6,168,474 B1 | 1/2001 | German et al. |
| 6,215,372 B1 * | 4/2001 | Novak .......................... 333/12 |
| 6,270,381 B1 | 8/2001 | Adriaenssens et al. |
| 6,353,540 B1 | 3/2002 | Narizuka et al. |
| 6,379,157 B1 | 4/2002 | Curry et al. |
| 6,441,314 B2 * | 8/2002 | Rokugawa et al. ......... 174/255 |
| 6,483,715 B1 | 11/2002 | Chen |
| 6,509,779 B2 | 1/2003 | Yue et al. |
| 6,528,145 B1 * | 3/2003 | Berger et al. ............... 428/156 |
| 6,533,618 B1 | 3/2003 | Aekins |
| 6,538,210 B2 * | 3/2003 | Sugaya et al. .............. 174/258 |

(Continued)

FOREIGN PATENT DOCUMENTS

| | | |
|---|---|---|
| EP | 1 059 704 | 12/2000 |
| WO | WO 03/019734 | 3/2003 |

OTHER PUBLICATIONS

Raghu Natarajan and J.P. Dougherty disclose Material Compatibility and Dielectric Properties of Co-Fired High and Low Dielectric Constant Ceramic Package in IEEE, 1997 Electronic Components and Technology Conference.*

*Primary Examiner*—Tuan T. Dinh
*Assistant Examiner*—Hoa C Nguyen
(74) *Attorney, Agent, or Firm*—Geissler, Olds & Lowe, PLLC

(57) ABSTRACT

A printed circuit board (PCB) is provided that maximizes compensation capacitance per unit area of the PCB while minimizing signal transmission delays in the PCB. The PCB includes a first section having a first dielectric constant (DK), a second section having a second DK lower than the first DK and provided above or below the first section, a plurality of crosstalk compensation elements provided in the first section, and a plurality of circuit elements provided in the second section.

20 Claims, 5 Drawing Sheets

U.S. PATENT DOCUMENTS

| | | | |
|---|---|---|---|
| 6,563,058 B2 * | 5/2003 | Mizutani et al. | 174/262 |
| 6,603,668 B2 * | 8/2003 | Iwanami | 361/794 |
| 6,663,946 B2 * | 12/2003 | Seri et al. | 428/209 |
| 6,678,144 B2 * | 1/2004 | Higashi et al. | 361/306.3 |
| 6,734,542 B2 * | 5/2004 | Nakatani et al. | 257/687 |
| 6,865,090 B2 * | 3/2005 | Wajima et al. | 361/793 |
| 6,972,893 B2 * | 12/2005 | Chen et al. | 359/296 |
| 6,984,886 B2 * | 1/2006 | Ahn et al. | 257/698 |
| 2001/0048592 A1 | 12/2001 | Nimomiya | |
| 2002/0088977 A1 | 7/2002 | Mori et al. | |
| 2002/0195270 A1 * | 12/2002 | Okubora et al. | 174/260 |
| 2003/0024732 A1 * | 2/2003 | Ninomiya | 174/255 |
| 2003/0075356 A1 * | 4/2003 | Horie | 174/256 |
| 2003/0174484 A1 | 9/2003 | Pai et al. | |
| 2003/0218870 A1 * | 11/2003 | Fisher et al. | 361/792 |
| 2004/0040740 A1 * | 3/2004 | Nakatani et al. | 174/256 |
| 2004/0147165 A1 * | 7/2004 | Celella et al. | 439/607 |
| 2004/0184247 A1 | 9/2004 | Adriaenssens et al. | |
| 2005/0254223 A1 | 11/2005 | Hashim et al. | |

* cited by examiner

MAXIMIZING CAPACITANCE PER UNIT AREA WHILE MINIMIZING SIGNAL TRANSMISSION DELAY IN PCB

BACKGROUND OF THE INVENTION

1. Field of the Invention

The present invention relates to the field of crosstalk compensation in connectors and, more particularly, to a technique of maximizing capacitance per unit area while minimizing signal transmission delays in crosstalk compensating printed circuit boards (PCBs).

2. Discussion of the Related Art

Noise or signal interference between conductors in a connector is known as crosstalk. Crosstalk is a common problem in devices using connectors. Particularly, in a system where a modular plug often used with a computer is to mate with a modular jack, the electrical wires (conductors) within the jack and/or plug produce crosstalk.

U.S. Pat. No. 5,997,358 issued to Adriaenssens et al. (hereinafter "the '358 patent") describes a multi-stage scheme for compensating crosstalk in connectors. The entire contents of the '358 patent are incorporated by reference. Further, the subject matters of U.S. Pat. Nos. 5,915,989; 6,042,427; 6,050,843; and 6,270,381 are also incorporated by reference.

As Illustrated in FIG. 4, the The '358 patent reduces original crosstalk in a modular jack 60 of a connector that receives a plug. The jack 60 includes a PCB 600 with conductors placed on the PCB layers. The original crosstalk between the conductors (Jackwires 61) of the jack 60 is reduced or compensated for by adding a fabricated (compensation) crosstalk at two compensation stages thereby canceling the crosstalk in the plug-jack combination. The compensation crosstalk is created by placing capacitors on the PCB layers and providing crossed-over conductors at different locations (stages) on the PCB layers.

In such crosstalk compensating systems, it is desirable for the crosstalk compensating PCB to have a high dielectric constant (DK) to minimize the PCB space used to achieve the needed capacitive crosstalk compensation. However, the use of a high DK material for the PCB results in long delays in the signal transmission paths of the conductors between the compensation stages which is detrimental to the high frequency performance of the connector.

Therefore, there exits a need for a technique capable of maximizing an efficient PCB space utilization for the capacitive crosstalk compensation while minimizing signal transmission delays in the PCB.

SUMMARY OF THE INVENTION

The present Invention overcomes the problems and limitations of the related art crosstalk compensation devices (FIG. 4). Particularly, the present invention (FIG. 5) provides a crosstalk compensating PCB 10 having some layer(s) made of a high dielectric constant (DK) material and other layers made of a low DK material. Then the crosstalk compensating capacitors are made to reside at those layers with the high DK material, while other electronic components are made to reside at the layers with the low DK material. This provides the PCB that maximizes the compensating capacitance per unit area while minimizing signal transmission delays.

BRIEF DESCRIPTION OF THE DRAWINGS

The aspects of the invention will be apparent from the following detailed description of the embodiments of the present invention with reference to the accompanying drawings, in which.

DETAILED DESCRIPTION OF THE PREFERRED EMBODIMENTS

Figure 1:
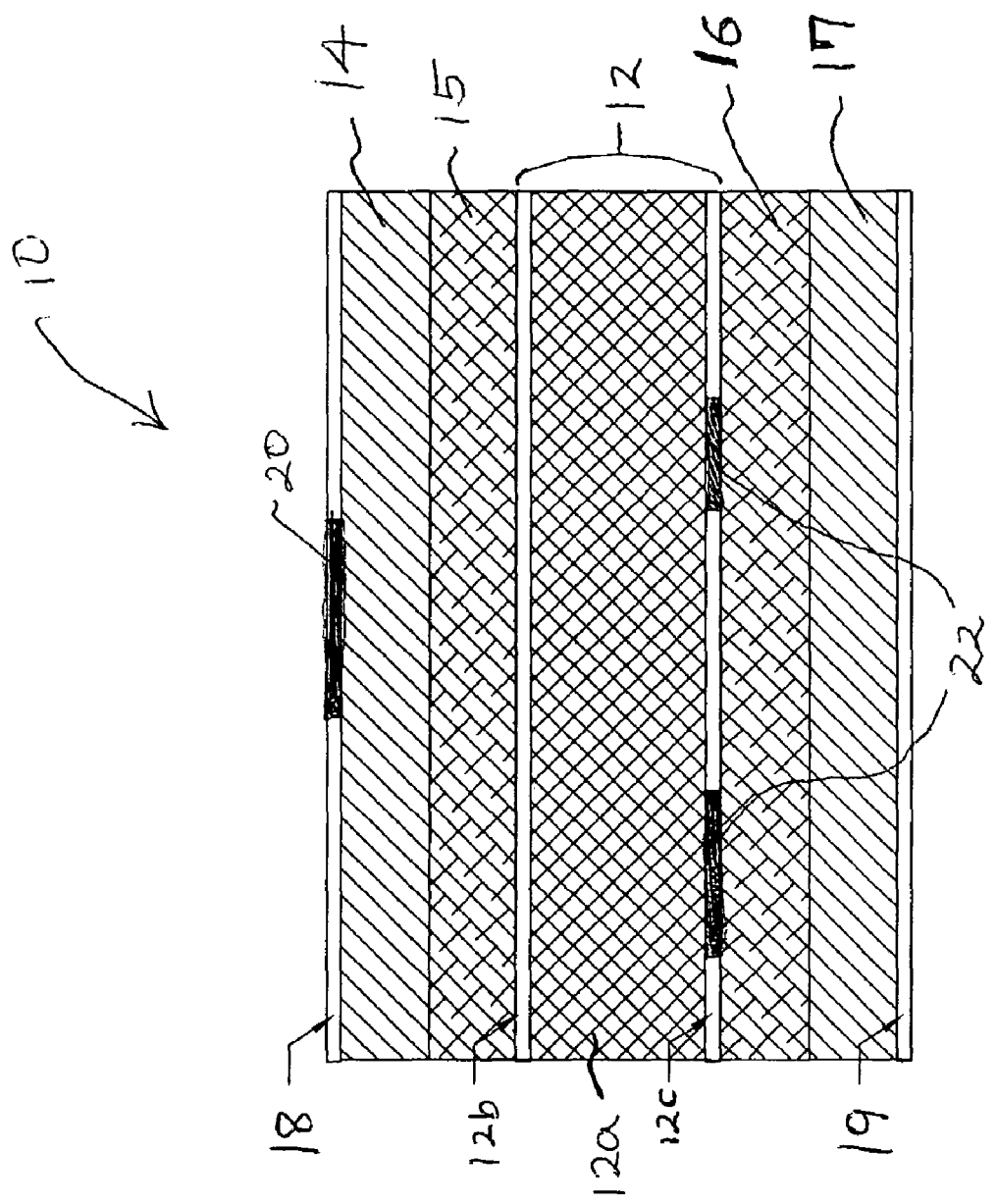
FIG. 1 is a cross-sectional view of a crosstalk compensating PCB according to a first embodiment of the present invention.

Reference will now be made in detail to the preferred embodiments of the present invention, examples of which are illustrated in the accompanying drawings. In the drawings, same reference numerals are used to indicate same elements.

The present invention provides a multilayer board such as a PCB having different layers with different dielectric constants. Such a board is used to provide crosstalk compensation. A dielectric constant is a well-known term used to describe the ability of a material to store electrostatic energy. The board includes layer(s) made of a high dielectric constant (DK) material and layers made of a low DK material. Then the crosstalk compensating capacitors are made to reside at those layers with the high DK material, while the other components such as conductors for transmitting signals are made to reside at the layers with the low DK material. This provides the board that maximizes the compensating capacitance per unit area while minimizing signal transmission delays.

FIG. 1 is a cross-sectional view of a crosstalk compensating PCB 10 according to a first embodiment of the present invention.

Referring to FIG. 1, the PCB 10 includes a laminate or core 12, first through fourth prepregs 14, 15, 16 and 17, and a plurality of metalized layers 18 and 19. Prepregs are dielectric material sheets known in the art. A laminate/core is also known, and can be made of a copper clad dielectric material substrate 12a with copper sheets (metalized layers) 12b and 12c formed respectively on top and bottom of the dielectric material substrate 12a. The metalized layers 18 and 19 can be a copper foil or other suitable conductive layer.

The top metalized layer 18, the first prepreg 14 and the second prepreg 15 are stacked up in that order on the top copper sheet 12b of the laminate/core 12. The third prepreg 16, the fourth prepreg 17, and the bottom metalized layer 19 are provided in that order under the bottom copper sheet 12c of the laminate/core 12.

The laminate/core 12 (i.e., the substrate 12a) is made of a high DK material. The first and fourth prepregs 14 and 17 are made of a low DK material. The second and third prepregs 15 and 16 are made of a high DK material.

Because the laminate/core 12 and the second and third prepregs 15 and 16 are made with the high DK material(s), compensation capacitive elements 22 used to compensate for the crosstalk are placed on or as part of the copper sheet(s) 12b and/or 12c of the laminate/core 12 at different compensation stages of the PCB 10. The capacitive elements 22 can be interdigital capacitors or plates of parallel plate capacitors. An interdigital capacitor is a capacitor having a co-planar arrangement of two inter-meshed metal combs each at a different potential, and is known. A parallel plate capacitor is a capacitor composed of two parallel metal plates each at a different potential, and is also known. Moreover the capacitive elements 22 can be buried vias formed as part of the copper sheets 12b and 12c and dielectric material substrate 12a of the laminate/core 12. It is known that a capacitor can be made with two vias each at a different potential. According to this configuration, the needed crosstalk compensation is provided in the PCB 10 by the presence of the compensation capacitive elements 22 and, at the same time, the compensation capacitance per unit area on the PCB 10 is maximized because the high DK PCB layers provide a high capacitance per unit area on the PCB. Furthermore, this configuration provides a compact design for the PCB 10.

Moreover, because the top and bottom metalized layers 18 and 19 are adjacent to the first and fourth prepregs 14 and 17 made with the low DK material(s), circuit elements 20 are placed on or as part of the top and/or bottom metalized layers 18 and 19. The circuit elements 20 are electronic elements primarily used to provide the transmission paths for the signals through the PCB 10. The circuit elements 20 can be conductive traces, resistive elements, inductive elements, etc. The low DK materials surrounding the circuit elements 20 prevent long signal transmission delays as the signals travel along the circuit elements 20, such that they can be transmitted significantly more quickly throughout the PCB 10. As a result, the PCB 10 maximizes the compensation capacitance per unit area while minimizing signal transmission delays in the PCB 10.

Figure 2:
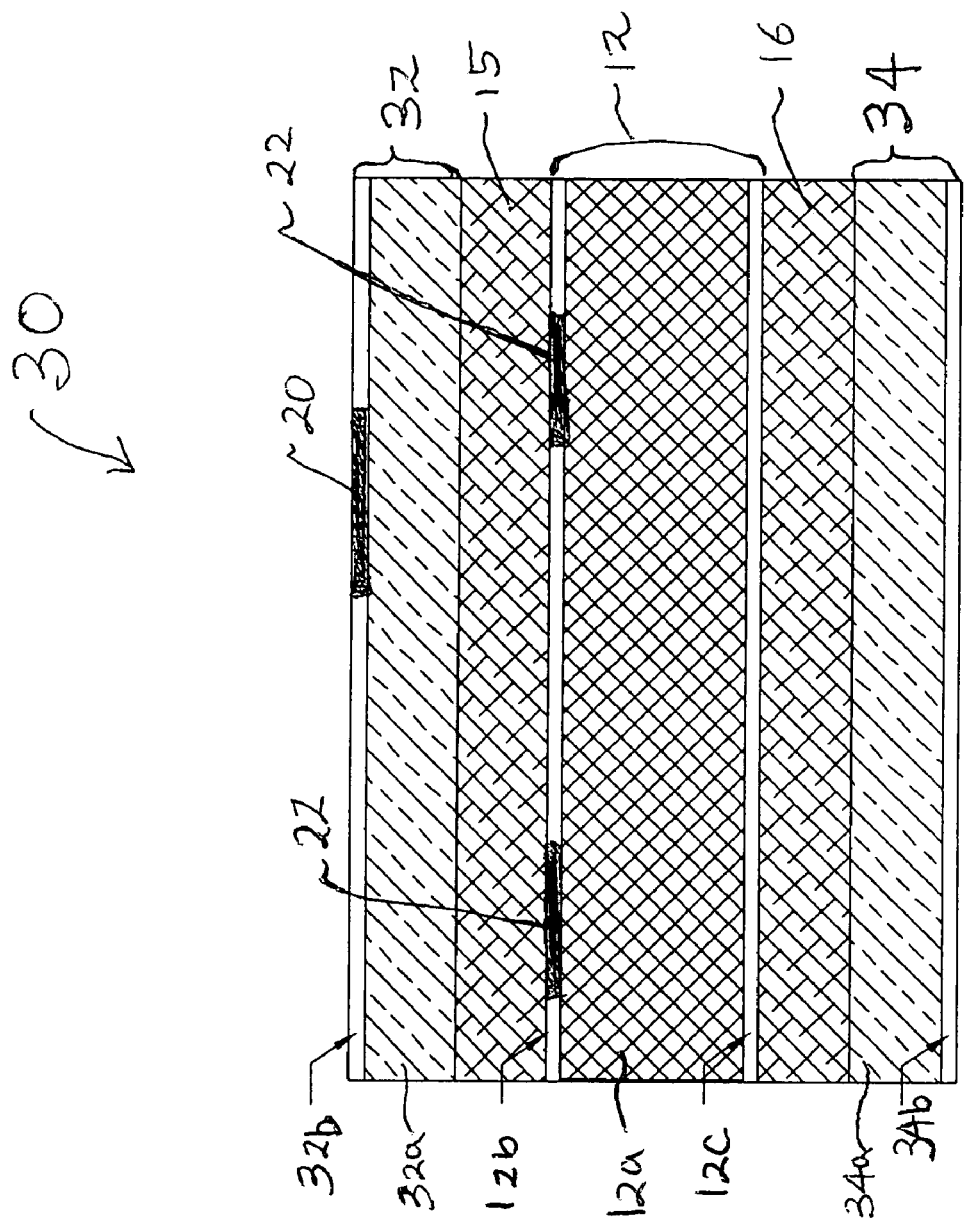
FIG. 2 is a cross-sectional view of a crosstalk compensating PCB according to a second embodiment of the present invention.

FIG. 2 is a cross-sectional view of a crosstalk compensating PCB 30 according to a second embodiment of the present invention. The PCB 30 is identical to the PCB 10 of the first embodiment, except that in the second embodiment, each of the low DK layers as well as the abutting metalized layer is replaced by a laminate/core made of a low DK material, with one of its copper sheets etched out.

Particularly, referring to FIG. 2, the PCB 30 includes the high DK laminate/core 12, the high DK prepreg 15 formed on the laminate/core 12, the high DK prepreg 16 formed under the laminate/core 12, a top laminate/core 32, and a bottom laminate/core 34, all stacked up in the order as shown in FIG. 2.

The top laminate/core 32 includes a low DK substrate 32a (e.g., a copper clad substrate with a low DK) and only one copper sheet (metalized layer) 32b formed on one side of the low DK substrate 32a. Similarly, the bottom laminate/core 34 includes a low DK substrate 34a (e.g., a copper clad substrate with a low DK) and only one copper sheet (metalized layer) 34b formed on one side of the low DK substrate 34a.

Generally, a laminate/core includes a dielectric material substrate and two copper sheets formed on top and bottom of the substrate. In one implementation, as the top and bottom laminates/cores 32 and 34, a low DK laminate/core that is commercially available can be used by etching out or removing one of the copper sheets from the low DK laminate/core. This reduces the cost of the PCB and simplifies the PCB fabrication process.

Because the laminate/core 12 and the second and third prepregs 15 and 16 are made with the high DK material(s), the compensation capacitive elements 22 are placed on or as part of the copper sheet(s) 12b and/or 12c and/or dielectric material substrate 12a of the laminate/core 12 at different compensation stages of the PCB 30. According to this configuration, the needed crosstalk compensation is provided in the PCB 30 and, at the same time, the compensation capacitance per unit area on the PCB 30 is maximized because of the presence of the high DK PCB layers surrounding the compensation capacitive elements 22.

Moreover, because the copper sheets 32b and 34b are adjacent to the substrates 32a and 34a made with the low DK material(s), the circuit elements 20 are placed on or as part of the copper sheet(s) 32b and/or 34b. The low DK materials surrounding the circuit elements 20 prevent long signal transmission delays between the circuit elements 20. As a result, the PCB 30 maximizes the compensation capacitance per unit area while minimizing signal transmission delays in the PCB 30.

Figure 3:
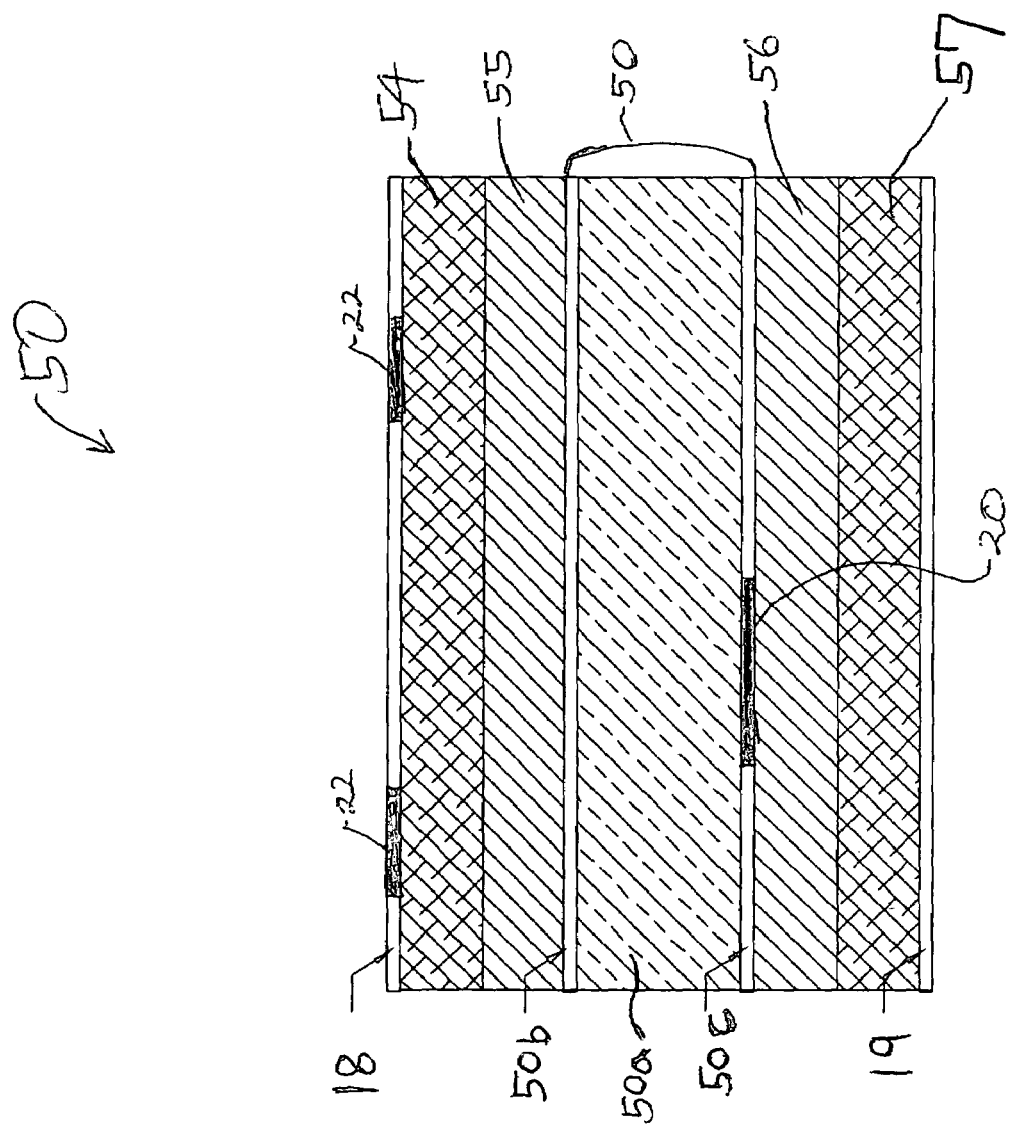
FIG. 3 is a cross-sectional view of a crosstalk compensating PCB according to a third embodiment of the present invention.
Figure 4:
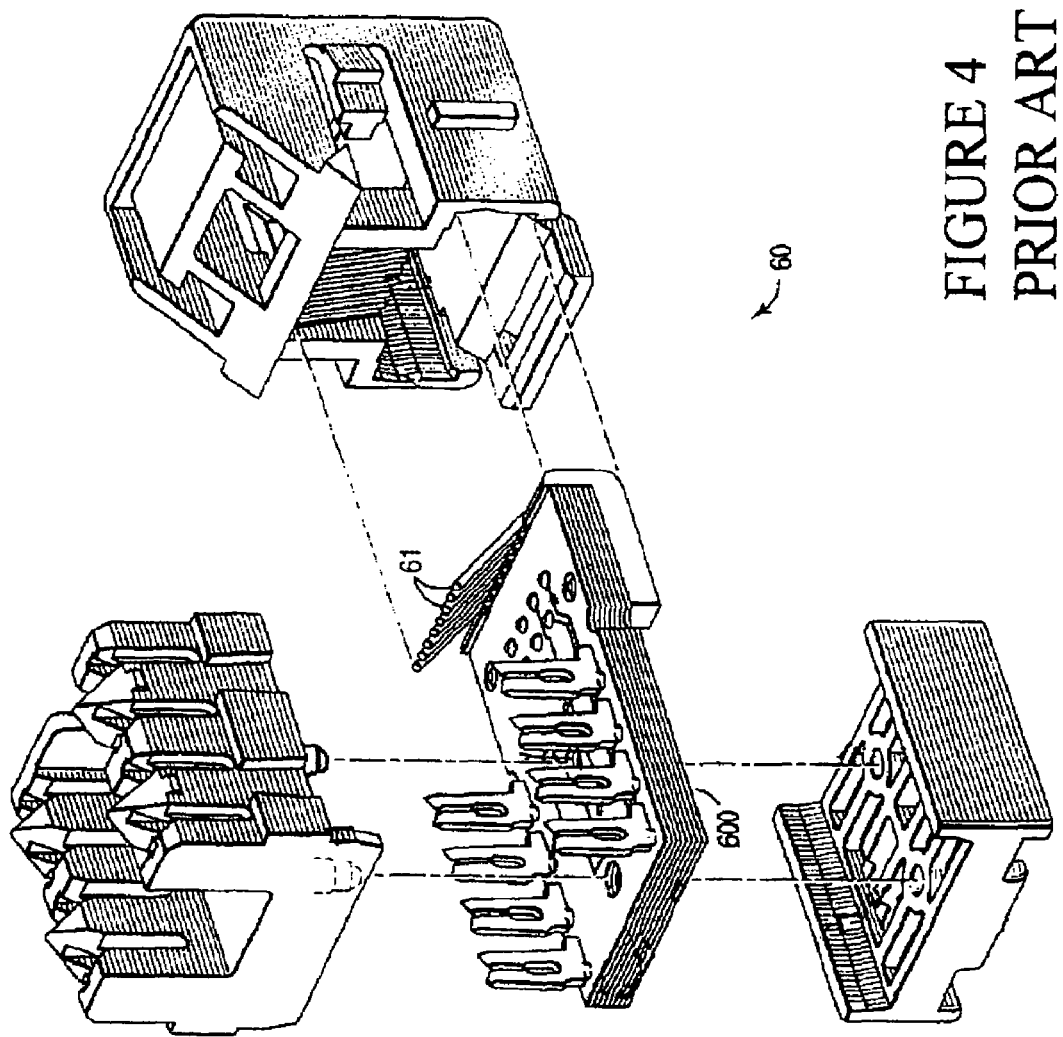
FIG. 4 is a perspective view of a modular connector, in accordance with the related art.
Figure 5:
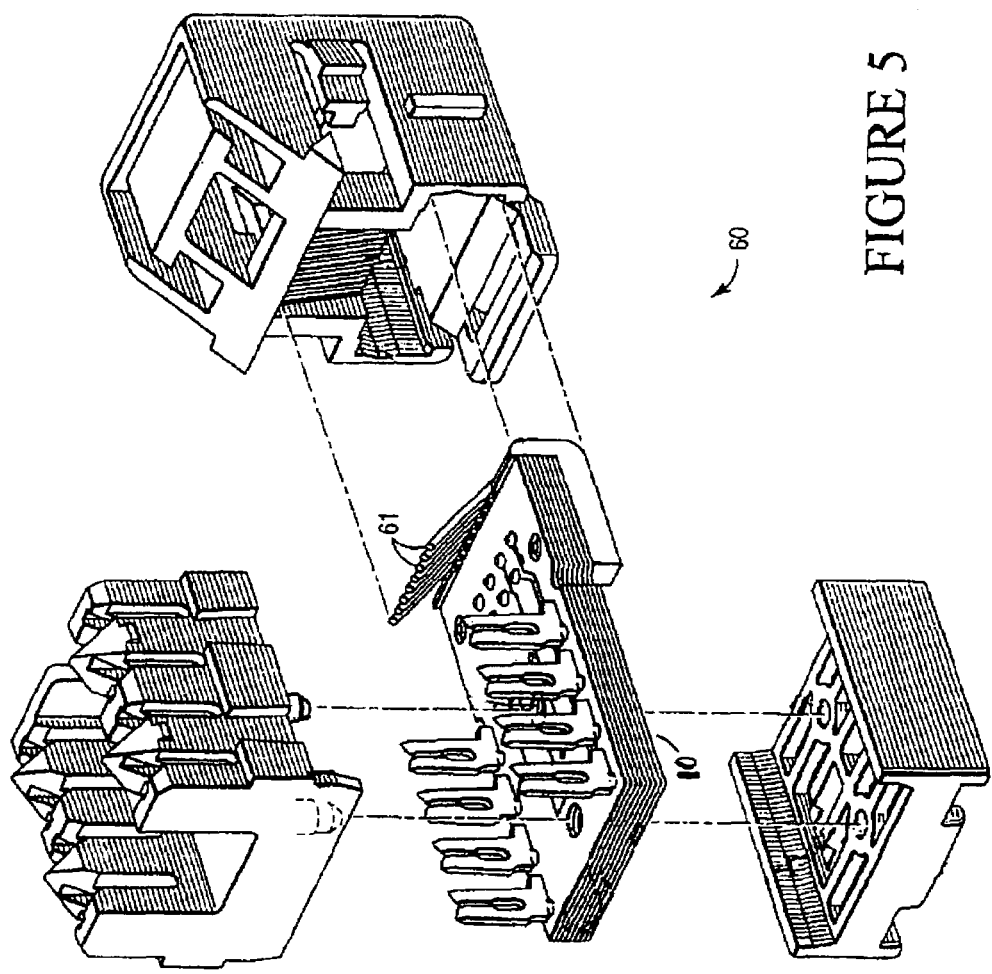
FIG. 5 is a perspective view of a modular connector, in accordance with the present invention.

FIG. 3 is a cross-sectional view of a crosstalk compensating PCB 50 according to a third embodiment of the present invention. This embodiment is used when it is desired to have the compensation elements reside on the top and/or bottom metalized layers and the signal transmission paths reside on the inner metalized layers of the PCB 50. In this embodiment, instead of having low DK materials at the outer layers of the PCB and having high DK materials at the inner layers of the PCB as in FIG. 1, low DK materials are present at the inner layers of the PCB and high DK materials are present at the outer layers of the PCB.

Particularly, referring to FIG. 3, the PCB 50 includes a laminate/core 50, first through fourth prepregs 54, 55, 56 and 57, and the top and bottom metalized layers 18 and 19, all stacked up as shown in FIG. 3. The laminate/core 50 is composed of a low DK substrate 50a (e.g., a low DK copper clad material substrate) and copper sheets 50b and 50c (metalized layers) formed respectively on top and bottom of the low DK substrate 50a.

The first and fourth prepregs 54 and 57 are made of a high DK material. The second and third prepregs 55 and 56 are made of a low DK material.

Because the prepregs 54 and 57 are made with the high DK material(s), the compensation capacitive elements 22 are placed on or as part of the top and/or bottom metalized layer 18 and/or 19 at different compensation stages of the PCB 50. According to this configuration, the needed crosstalk compensation is provided in the PCB 50 and, at the same time, the compensation capacitance per unit area on the PCB 50 is maximized because of the presence of the high DK PCB layers surrounding the compensation elements 22.

Moreover, because the laminate/core 50 and the prepregs 55 and 56 are made with the low DK material(s), the circuit elements 20 are placed on or as part of the copper sheet(s) 50b and/or 50c. The low DK materials surrounding the circuit elements 20 prevent long signal transmission delays between the circuit elements 20. As a result, the PCB 50 maximizes the compensation capacitance per unit area while minimizing signal transmission delays, when it is desired to have the compensation capacitors/elements reside on the top and/or bottom metalized layers and the signal transmission paths reside on the inner metalized layers in the PCB 50.

In the embodiments of the present invention, a high DK can be in the range of 4.0 to 5.0, and a low DK can be in the range of 2.5 to 3.5. Preferably, a high DK can be at or about 4.5 and a low DK can be at or about 3.0. For instance, in FIG. 1, the laminate/core 12 would have a DK of 4.5, the first and fourth prepregs 14 and 17 would have a DK of 3.0, and the second and third prepregs 15 and 16 would have a DK of 4.5.

Also, in the embodiments of the present invention, as the compensation capacitors 22, various types of capacitors can be used. For instance, interdigital capacitors, parallel plate capacitors, or capacitors formed by buried vias can be used. These elements are known in the art.

Although five PCB substrates (excluding the metalized layers) are illustrated in the drawings, it should be readily apparent that any other number of PCB substrates and/or metalized layers may be used for the PCB. An important aspect is that where the compensation elements 22 are to be placed, a high DK material surrounds them, and where the electronic elements 20 are to be placed, a low DK material surrounds them.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention.

What is claimed is:

1. An apparatus comprising:
   a modular connector with a printed circuit board (PCB) including:
      circuit elements;
      a plurality of contacts mounted on said PCB adapted for contacting conductors of a mating connector, wherein at least some of said contacts are electrically connected to said circuit elements, and wherein original crosstalk occurs between at least some conductors of said mating connector;
      a first section of said PCB having a first dielectric constant (DK);
      a second section of said PCB having a second DK lower than the first DK, and provided above or below said first section; and
      at least one crosstalk compensation element utilizing said first section as a dielectric of a capacitor to provide compensating crosstalk to offset the original crosstalk, wherein said circuit elements are provided in said second section.

2. The apparatus of claim 1, wherein the first section includes:
   a first laminate including a substrate having the first DK and a metal sheet attached to at least one surface of said substrate;
   a first prepreg above the first laminate; and
   a second prepreg below the first laminate.

3. The apparatus of claim 2, wherein the first and second prepregs have the first DK.

4. The apparatus of claim 3, wherein the at least one crosstalk compensation element is provided at a metal sheet of the first laminate.

5. The apparatus of claim 3, wherein the second section includes:
   a third prepreg above the first prepreg;
   a first metal layer above the third prepreg;
   a fourth prepreg below the second prepreg; and
   a second metal layer below the fourth prepreg.

6. The apparatus of claim 5, wherein the third and fourth prepregs have the second DK.

7. The apparatus of claim 6, wherein the at least one circuit element is provided at the first and/or second metal layer, and at least a portion of the at least one crosstalk compensation element is provided at a metal sheet and/or the substrate of the first laminate.

8. The apparatus of claim 3, wherein the second section includes:
   a second laminate above the first prepreg; and
   a third laminate below the second prepreg,
   wherein the second and third laminates have the second DK.

9. The apparatus of claim 8, wherein each of the second and third laminates includes a dielectric material substrate and a single metal sheet on the substrate.

10. The apparatus of claim 9, wherein the at least one circuit element is provided at the single metal sheet of the second and/or third laminate, and at least a portion of the at least one crosstalk compensation element is provided at a metal sheet and/or the substrate of the first laminate.

11. The apparatus of claim 1, wherein the second section includes:
    a first laminate including a substrate having the second DK and a metal sheet attached to at least one surface of said substrate;
    a first prepreg above the first laminate; and
    a second prepreg below the first laminate.

12. The apparatus of claim 11, wherein the first and second prepregs have the second DK.

13. The apparatus of claim 12, wherein the first section includes:
    a third prepreg above the first prepreg;
    a first metal layer above the third prepreg;
    a fourth prepreg below the second prepreg; and
    a second metal layer below the fourth prepreg.

14. The apparatus of claim 13, wherein the third and fourth prepregs have the first DK.

15. The apparatus of claim 14, wherein at least a portion of the at least one crosstalk compensation element is provided at the first and/or second metal layer, and the at least one circuit element is provided at a metal sheet of the first laminate.

16. The apparatus of claim 1, wherein the first DK is in the range of 4.0-5.0, and the second DK is in the range of 2.5-3.5.

17. The apparatus of claim 1, wherein the at least one crosstalk compensation element includes a plurality of capacitors placed at different compensation stages of the PCB.

18. The apparatus of claim 1, wherein the at least one crosstalk compensation element includes a first capacitor for providing a first phase of compensating crosstalk to offset the original crosstalk and a second capacitor for providing a second phase of compensating crosstalk to offset the original crosstalk.

19. The apparatus of claim 1, wherein said modular connector is a modular jack.

20. An apparatus comprising:
    a modular connector with a printed circuit board (PCB) including:
       circuit elements;
       a plurality of contacts mounted on said PCB adapted for contacting conductors of a mating connector, wherein at least some of said contacts are electrically connected to said circuit elements, and wherein original crosstalk occurs between at least some conductors of said mating connector;
       a first section of said PCB having a first dielectric constant (DK);
       a second section of said PCB having a second DK lower than the first DK, and provided above or below said first section; and
       at least one crosstalk compensation element utilizing said first section to provide compensating crosstalk to offset the original crosstalk, wherein said circuit elements are provided in said second section, wherein the first DK is less than 5.0.

* * * * *